United States Patent
Seo et al.

(10) Patent No.: US 10,186,215 B2
(45) Date of Patent: Jan. 22, 2019

(54) DISPLAY DEVICE

(71) Applicant: Samsung Display Co., Ltd., Yongin-si, Gyeonggi-do (KR)

(72) Inventors: Jun Seon Seo, Yongin-si (KR); Sun Ja Kwon, Yongin-si (KR); Yang Wan Kim, Yongin-si (KR); Seung Woo Sung, Yongin-si (KR); Yun Kyeong In, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 138 days.

(21) Appl. No.: 15/157,341

(22) Filed: May 17, 2016

(65) Prior Publication Data

US 2016/0379578 A1 Dec. 29, 2016

(30) Foreign Application Priority Data

Jun. 29, 2015 (KR) ........................ 10-2015-0092540

(51) Int. Cl.
*G09G 5/00* (2006.01)
*G09G 3/36* (2006.01)
*H01L 27/12* (2006.01)

(52) U.S. Cl.
CPC .......... *G09G 3/3611* (2013.01); *H01L 27/124* (2013.01); *H01L 27/1255* (2013.01); *G09G 2300/043* (2013.01); *G09G 2300/0408* (2013.01); *G09G 2300/0413* (2013.01); *G09G 2330/04* (2013.01)

(58) Field of Classification Search
CPC ............ G09G 3/3611; G09G 2330/04; G09G 2300/043; G09G 2300/0408; G09G 2300/0413; H01L 27/1255; H01L 27/124
See application file for complete search history.

(56) References Cited

U.S. PATENT DOCUMENTS 6,373,109 B1 4/2002 Ahn
8,400,437 B2 3/2013 Kim et al.
(Continued)

FOREIGN PATENT DOCUMENTS

KR 10-2000-0019488 A 4/2000
KR 10-2008-0062264 A 7/2008
(Continued)

*Primary Examiner* — Jonathan Boyd
(74) *Attorney, Agent, or Firm* — Lewis Roca Rothgerber Christie LLP

(57) ABSTRACT

A display device includes: a display panel having a display area with a plurality of pixel areas and a non-display area adjacent the display area, the display panel may include a substrate including at least one thin film transistor in each of the pixel areas and a display element connected to the thin film transistor; lighting circuits in the non-display area on the substrate to check lighting states of the display element; signal wires in the non-display area on the substrate to supply a signal to the lighting circuits; dummy circuits including a plurality of dummy capacitors, each of which include a first dummy capacitor electrode and a second dummy capacitor electrode, wherein the dummy circuits collect external static electricity coming through the signal wires before the external static electricity flows into the lighting circuits.

10 Claims, 8 Drawing Sheets

(56) References Cited

U.S. PATENT DOCUMENTS

| | | | |
|---|---|---|---|
| 2008/0106661 A1* | 5/2008 | Kim | G02F 1/1345 |
| | | | 349/40 |
| 2008/0165110 A1 | 7/2008 | Kim et al. | |
| 2010/0321348 A1* | 12/2010 | Kim | G09G 3/20 |
| | | | 345/204 |

FOREIGN PATENT DOCUMENTS

| KR | 10-2008-0064531 A | 7/2008 |
|---|---|---|
| KR | 10-2012-0044769 A | 5/2012 |

* cited by examiner

DISPLAY DEVICE

CROSS-REFERENCE TO RELATED APPLICATION

This application claims priority to and the benefit of Korean Patent Application No. 10-2015-0092540 filed in the Korean Intellectual Property Office on Jun. 29, 2015, the entire contents of which are incorporated herein by reference.

BACKGROUND

1. Field

Embodiments of the present invention relate to a display device.

2. Description of the Related Art

Various flat panel display devices such as organic light emitting diode (OLED) displays, liquid crystal displays (LCDs), electrophoresis displays (EPDs), and electro-wetting displays (EWDs) have been developed.

The flat panel display device may include display elements in pixel areas, and lighting circuits for checking a lighting state of the display elements.

Signal wires that transmit lighting signals for turning on the lighting circuits may become an inflow path of static electricity, which may damage the lighting circuits. Accordingly, it is desirable to prevent the static electricity from flowing into the lighting circuits through the signal wires.

SUMMARY

Embodiments of the present invention provide a display device capable of preventing or substantially preventing lighting circuits from being damaged by static electricity.

An exemplary embodiment of the present invention provides a display device including a display panel, lighting circuits, signal wires, and dummy circuits. The display panel has a display area with a plurality of pixel areas and a non-display area adjacent the display area. The display panel may include a substrate with at least one thin film transistor disposed in each of the pixel areas, and a display element connected to the thin film transistor. The lighting circuits may be in the non-display area on the substrate to check a lighting state of the display element. The signal wires may be disposed in the non-display area on the substrate to supply a signal to the lighting circuits. The dummy circuits may include a plurality of dummy capacitors, each of which includes a first dummy capacitor electrode and a second dummy capacitor electrode. The dummy circuits collect external static electricity coming through the signal wires before the external static electricity flows into the lighting circuits and.

The lighting circuits may include a plurality of lighting thin film transistors having a gate electrode, a source electrode and a drain electrode, and the signal wires may include a first signal wire connected to the gate electrode of the lighting thin film transistor and a second signal wire connected to the source electrode of the lighting thin film transistor.

The first dummy capacitor electrode is connected to the first signal wire and the second dummy capacitor electrode is connected to the second signal wire.

A distance between the first signal wire and the second signal wire may be in a range of about 2 um to 10 um.

The thin film transistor in the pixel area may include a semiconductor layer, a gate electrode, a gate insulating layer for insulating the semiconductor layer from the gate electrode, a source electrode, and a drain electrode. The first dummy capacitor electrode may be at the same layer as the gate electrode of the thin film transistor in the pixel area, and the second dummy capacitor electrode may be at the same layer as the semiconductor layer.

The display device may further include an interlayer insulating layer covering the gate electrode. The first signal wire may be at the same layer as the first dummy capacitor electrode and the second signal wire may be on the interlayer insulating layer.

The second signal wire and the second dummy capacitor electrode may be connected to each other through a contact hole.

The first dummy capacitor electrode may be connected to the first signal wire and the second dummy capacitor electrode may be insulated from the first and second signal wires.

Some of the second dummy capacitor electrodes of the dummy capacitors may be insulated from the first and second signal wires and others of second dummy capacitor electrodes may be connected to the second signal wire.

A region in which the second dummy capacitor electrode is connected to the second signal wire may be positioned between the lighting circuit and a region in which the second dummy capacitor electrode is insulated from the second signal.

A distance between the first signal wire and the second signal wire in the region in which the second dummy capacitor electrode is insulated from the second signal wire may be larger than a distance between the first signal wire and the second signal wire in the region in which the second dummy capacitor electrode is connected to the second signal wire.

As mentioned above, the display device of embodiments of the present invention further include the dummy circuits capable of dissipating the static electricity before it flows into the lighting circuits. Accordingly, damages of the lighting circuits caused by the static electricity can be prevented or substantially prevented.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete and will fully convey the scope of the example embodiments to those skilled in the art.

In the drawing figures, dimensions may be exaggerated for clarity of illustration. Like reference numerals refer to like elements throughout.

DETAILED DESCRIPTION

Figure 1:
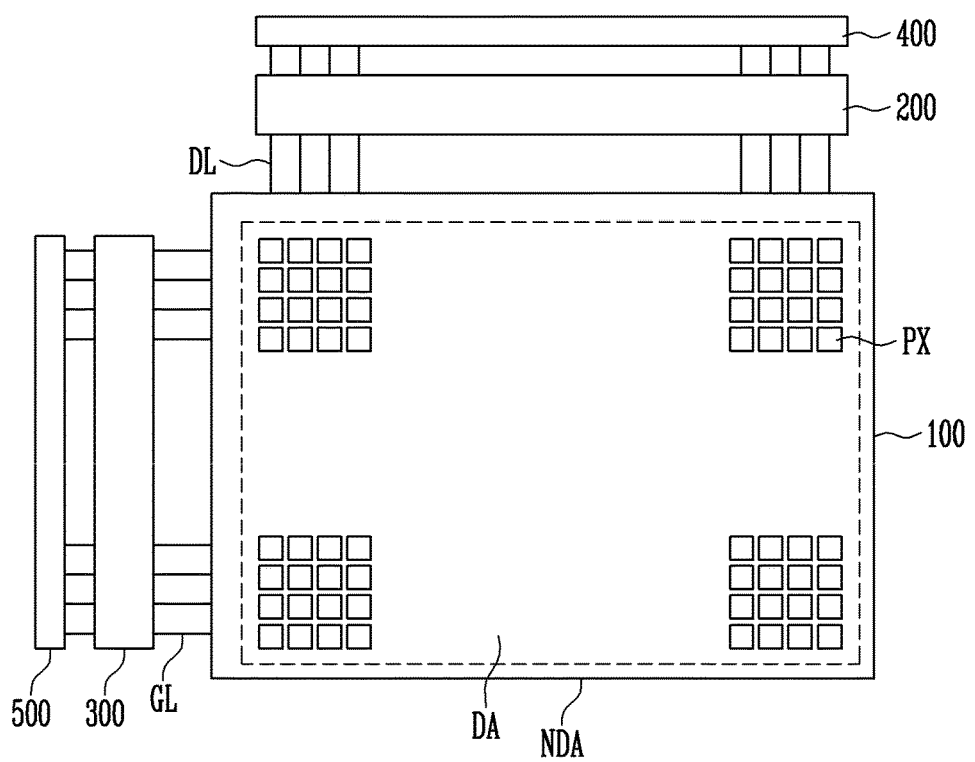
FIG. 1 is a plan view for illustrating a display device according to an exemplary embodiment of the present invention.

The present invention may be understood more readily by reference to the following detailed description of embodiments and accompanying drawings. However, the present invention may be embodied in many different forms, and should not be construed as being limited to the embodiments set forth herein. Rather, these embodiments are provided so that this disclosure will be through and complete and will fully convey the concept of the invention to those skilled in the art, and the present invention will only be defined by the appended claims.

It will be understood that, although the terms "first", "second", "third", etc., may be used herein to describe various elements, components, regions, layers, and/or sections, these elements, components, regions, layers and/or sections should not be limited by these terms. These terms are used to distinguish one element, component, region, layer or section from another element, component, region, layer or section. Thus, a first element, component, region, layer, or section discussed below could be termed a second element, component, region, layer, or section, without departing from the spirit and scope of the present invention.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

Further, it will also be understood that when one element, component, region, layer and/or section is referred to as being "between" two elements, components, regions, layers, and/or sections, it can be the only element, component, region, layer and/or section between the two elements, components, regions, layers, and/or sections, or one or more intervening elements, components, regions, layers, and/or sections may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprise," "comprises," "comprising," "includes," "including," and "include," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

It will be understood that when an element or layer is referred to as being "on," "connected to," "coupled to," "connected with," "coupled with," or "adjacent" another element or layer, it can be "directly on," "directly connected to," "directly coupled to," "directly connected with," "directly coupled with," or "directly adjacent" the other element or layer, or one or more intervening elements or layers may be present. Further "connection," "connected," etc. may also refer to "electrical connection," "electrically connect," etc. depending on the context in which they are used as those skilled in the art would appreciate. When an element or layer is referred to as being "directly on," "directly connected to," "directly coupled to," "directly connected with," "directly coupled with," or "immediately adjacent" another element or layer, there are no intervening elements or layers present.

As used herein, the term "substantially," "about," and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

Also, any numerical range recited herein is intended to include all subranges of the same numerical precision subsumed within the recited range. For example, a range of "1.0 to 10.0" or between "1.0 and 10.0" are intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include ail higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112, first paragraph, and 35 U.S.C. § 132(a).

Further, in exemplary embodiments, for components having the same configuration, like reference numerals are used and described only in a representative embodiment.

Exemplary embodiments of the present invention will be described in detail with reference to the accompanying figures.

Figure 2:
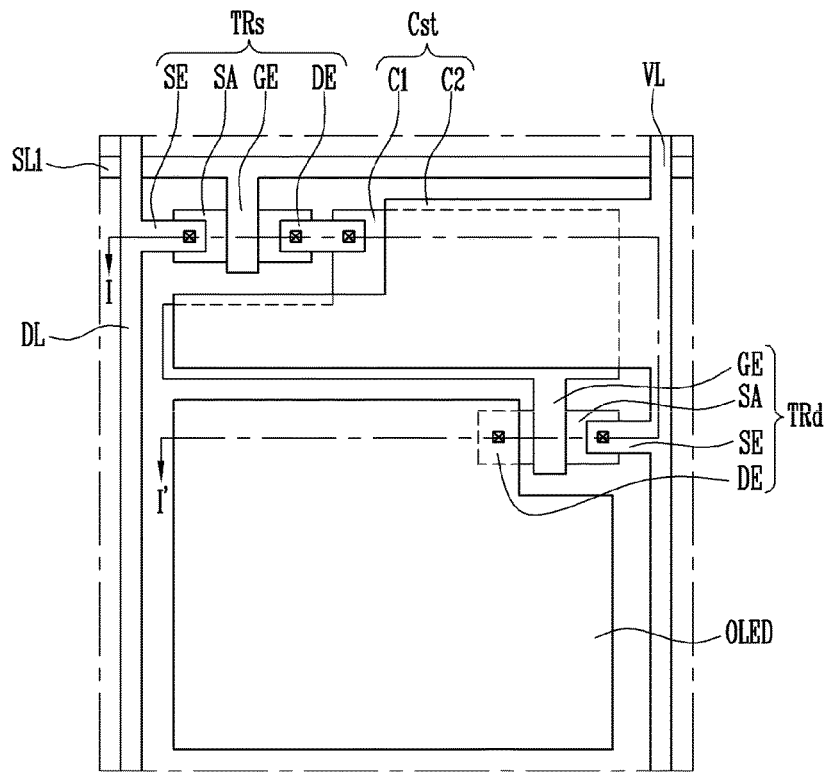
FIG. 2 is a plan view of a pixel shown in FIG. 1.
Figure 3:
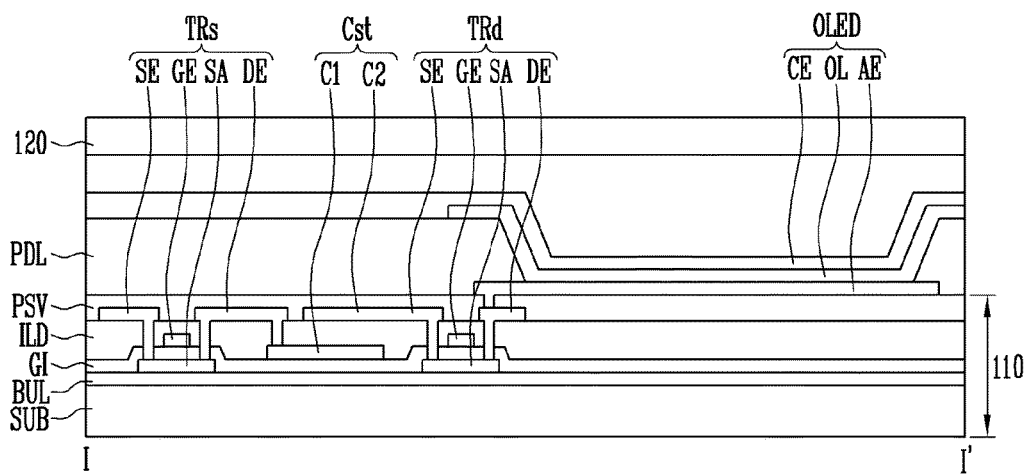
FIG. 3 is a cross-sectional view taken along the line I-I' of FIG. 2.

FIG. 1 is a plan view for illustrating a display device according to an exemplary embodiment of the present invention, FIG. 2 is a plan view of a pixel shown in FIG. 1, and FIG. 3 is a cross-sectional view taken along the line I-I' of FIG. 2.

Referring to FIGS. 1 through 3, a display device according to an exemplary embodiment of the present invention may include a display panel 100, a data driver 200, a gate driver 300, a data lighting circuit driver 400, and a gate lighting circuit driver 500.

The display panel 100 may include a display area DA in which an image is displayed, and a non-display area NDA adjacent the display area DA. The display area DA includes a plurality of pixel areas PX in which display elements (e.g., organic light emitting diodes OLEDs) are disposed. The respective pixel areas PX may emit light of different colors. For example, the color of light emitted from the pixel areas PX may be one of cyan, magenta, yellow, and white.

The gate driver 300 is configured to supply a scan signal to the pixel areas PX of the display area DA through a plurality of gate lines GL, and the data driver 200 is configured to supply a data signal to the pixel areas PX of the display area DA through a plurality of data lines DL. Accordingly, the display elements OLED of the pixel areas PX may emit light in response to the scan signal and the data signal.

The gate lighting circuit driver 500 and the data lighting circuit driver 400 may be electrically connected to lighting circuits and dummy circuits through the gate lines GL and the data lines DL. The lighting circuits may check a lighting state of the display elements OLED, and the dummy circuits may first induce static electricity before it flows into the lighting circuits.

Meanwhile, the display panel 100 is not limited to a particular type. In other words, various suitable types of display panels may be used for the display panel 100. For example, a self-emission display panel, such as an organic light emitting display panel, may be used for the display panel 100. Also, a non-emission display panel, such as a liquid crystal display panel, an electrophoresis display panel, or an electro-wetting display panel, may be used for the display panel 100. In the case of using the non-emission display panel, a back light unit for supplying light to the display panel 100 may be included in the display device. In this exemplary embodiment, the case in which the organic light emitting display panel is used for the display panel 100 is described as an example.

The display panel 100 will be described below in more detail. The display panel 100 may include a substrate 110, the display element OLED in the pixel area PX of the substrate 110, and an encapsulation member 120 covering the display element OLED.

The pixel area PX may include a switching thin film transistor TRs, a driving thin film transistor TRd, and a capacitor Cst, which are disposed on a base substrate SUB.

The switching thin film transistor TRs may be connected to the gate line GL and the data line DL, and the driving thin film transistor TRd and the capacitor Cst may be connected to a power supplying line VL. The switching thin film transistor TRs and the driving thin film transistor TRd may include a semiconductor layer SA, a gate electrode GE insulated from the semiconductor layer SA, and a source electrode SE and a drain electrode DE that are electrically connected to the semiconductor layer SA.

The base substrate SUB includes a transparent insulating material allowing light to pass therethrough. The base substrate SUB may be a rigid substrate. For example, the base substrate SUB may be one of a glass-based substrate, a quartz-based substrate, a glass ceramic-based substrate and a crystalline glass-based substrate.

In addition, the base substrate SUB may be a flexible substrate. In this case, the base substrate SUB may be one of a film base substrate including a polymer organic material, and a plastic base substrate. For example, the base substrate SUB may include polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), triacetate cellulose (YAC), and/or cellulose acetate propionate (CAP). In addition, the base substrate SUB may include fiberglass reinforced plastic.

Materials used in the base substrate SUB may have thermal resistance, which is a useful characteristic in a manufacturing process of the display panel 100.

The semiconductor layer SA may include amorphous silicon (a-Si), polycrystalline silicon (p-Si), and/or an oxide semiconductor. Regions of the semiconductor layer SA, on which the source electrode SE and the drain electrode DE are formed, may be impurity-doped or impurity-injected source and drain regions. A region between the source region and the drain region may become a channel region. In this case, the oxide semiconductor may include at least one of Zn, In, Ga, Sn, and a mixture thereof. For example, the oxide semiconductor may include indium-gallium-zinc oxide (IGZO).

In the case in which the semiconductor layer SA includes the oxide semiconductor, a light-blocking layer may be disposed on or under the semiconductor layer SA to prevent or substantially prevent light from entering the semiconductor layer SA.

A buffer layer BUL may be between the semiconductor layer SA and the base substrate SUB. The buffer layer BUL may include at least one of a silicon oxide layer and a silicon nitride layer. For example, the buffer layer BUL may include the silicon oxide layer, and the silicon nitride layer disposed on the silicon oxide layer. The buffer layer BUL may prevent or substantially prevent impurities of the base substrate SUB from diffusing into the switching thin film transistor TRs or the driving thin film transistor TRd. In addition, the buffer layer BUL may prevent or substantially prevent external moisture and oxygen from permeating into the display element OLED. The buffer layer BUL may planarize the surface of the base substrate SUB.

A gate insulating layer GI covers the base substrate SUB on which the semiconductor layer SA is disposed to insulate the semiconductor layer SA from the gate electrode GE. The gate insulating layer GI may include at least one of silicon oxide (SiO2) and silicon nitride (SiNx).

The gate line GL and a first capacitor electrode C1 are disposed on the gate insulating layer GI. The gate line GL extends to the pixel area PX, and a partial portion of the gate line GL, which overlaps the channel region of the semiconductor layer SA, may be the gate electrode GE.

An interlayer insulating layer ILD may be disposed on the gate insulating layer GI and the gate electrode GE. That is, the interlayer insulating layer ILD may cover the gate electrode GE. The interlayer insulating layer ILD, like the gate insulating layer GI, may include at least one of silicon oxide (SiO2) and silicon nitride (SiNx). In addition, the interlayer insulating layer ILD may expose partial portions of the source and drain regions.

The data line DL, which crosses the gate line GL and is insulated therefrom, the power supply line VL, the source electrode SE, and the drain electrode DE are on the interlayer insulating layer ILD. The source electrode SE, the drain electrode DE, a second capacitor electrode C2, the data line DL, and the power supply line VL may include a material capable of reflecting light. For example, the source electrode SE, the drain electrode DE, the second capacitor electrode C2, the data line DL, and the power supply line VL may include aluminum and/or an aluminum alloy.

The source electrode SE and the drain electrode DE may be insulated from the gate electrode GE by the interlayer insulating layer ILD. The source electrode SE and the drain electrode DE are connected to the source region and the drain region, respectively.

Meanwhile, the case in which the driving thin film transistor TRd and the switching thin film transistor TRs are top gate type thin film transistors is described in this exemplary embodiment, but the present invention is not necessarily limited thereto. For example, at least one of the driving thin film transistor TRd and the switching thin film transistor TRs may be a bottom gate type thin film transistor.

The capacitor Cst includes the first capacitor electrode C1 and the second capacitor electrode C2. The first capacitor electrode C1 may be formed of the same material as, and on the same layer as, the gate line GL and the gate electrode GE. That is, the first capacitor electrode C1 may be on the gate insulating layer GI. The second capacitor electrode C2 may be formed of the same material as, and on the same layer as, the data line DL, the power supply line VL, the source electrode SE, and the drain electrode DE.

A passivation layer PSV is on the base substrate SUB on which the switching thin film transistor TRs, the driving thin film transistor TRd, and the capacitor Cst are formed. The passivation layer PSV may cover the switching thin film transistor TRs, the driving thin film transistor TRd, and the capacitor Cst. The passivation layer PSV may expose a partial portion of the drain electrode DE of the driving thin film transistor TRd.

The passivation layer PSV may include one or more layers. For example, the passivation layer PSV may include an inorganic passivation layer, and an organic passivation layer on the inorganic passivation layer. In this case, the inorganic passivation layer may include at least one of silicon oxide (SiO2) and silicon nitride (SiNx), and the organic passivation layer may include an organic insulating material allowing light to pass therethrough. For example, the organic passivation layer may include at least one of polyacrylates resin, epoxy resin, phenolic resin, polyamides resin, polyimides resin, unsaturated polyesters resin, polyphenylene ethers resin, poly-phenylene sulfides resin, and/or benzocyclobutene resin.

The display element OLED may be on the passivation layer PSV, and may be connected to the drain electrode DE of the driving thin film transistor TRd. In this case, the display element OLED may be an organic light emitting diode.

The display element OLED may include a first electrode AE connected to the drain electrode DE of the driving thin film transistor TRd, an organic layer OL on the first electrode AE, and a second electrode CE on the organic layer OL.

One of the first electrode AE and the second electrode CE may be an anode electrode of the display element OLED and the other may be a cathode electrode. For example, the first electrode AE may be the anode electrode, and the second electrode CE may be the cathode electrode.

In addition, one of the first electrode AE and the second electrode CE may be a transmissive electrode. For example, in the case in which the display element OLED is a bottom emission type organic light emitting diode, the first electrode AE may be the transmissive electrode, and the second electrode CE may be a reflective electrode. In addition, in the case in which the display element OLED is a top emission type organic light emitting diode, the first electrode AE may be the reflective electrode, and the second electrode CE may be the transmissive electrode. In addition, in the case in which the display element OLED is a dual-side emission type organic light emitting diode, both of the first electrode AE and the second electrode CE may be transmissive electrodes. In the present embodiment, the case in which the first electrode AE is the anode electrode, and in which the display element OLED is the bottom emission type organic light emitting diode, is described as an example.

The first electrode AE is on the passivation layer PSV, and may include a conductive oxide. For example, the first electrode AE may include at least one transparent conductive oxide, such as indium tin oxide (ITO), indium zinc oxide (IZO), aluminum zinc oxide (AZO), gallium doped zinc oxide (GZO), zinc tin oxide (ZTO), gallium tin oxide (GTO), and/or fluorine doped tin oxide (FTO).

A pixel definition layer PDL is on the first electrode AE, and may expose the first electrode AE. The pixel definition layer PDL may include an organic insulating material. For example, the pixel definition layer PDL may include at least one of polystylene (PS), polymethylmethacrylate (PMMA), polyacrylonitrile (PAN), polyamide (PA), polyimide (PI), polyarylether (PAE), heterocyclic polymer, parylene, epoxy resin, benzocyclobutene (BCB), siloxane based resin, and/or silane based resin.

The organic layer OL may have a multi-layered structure in which an emission layer EML is essentially included. For example, the organic layer OL may include: a hole injection layer HIL for injecting holes therethrough; a hole transport layer HTL with a prominent hole-transporting property for increasing chances of re-coupling of the holes and electrons by suppressing movement of the electrons failing to re-couple with the holes in the emission layer EML; an emission layer EML for emitting light by re-coupling the injected electrons with the holes; a hole blocking layer HBL for suppressing movement of the holes failing to re-couple with the electrons in the emission layer EML; an electron transport layer ETL for smoothly transporting the electrons into the emission layer EML; and an electron injection layer EIL for injecting the electrons therethrough. The light emitted from the emission layer EML may be one of red, green, blue, and white in the present embodiment, but the present invention is not limited thereto. For example, the light emitted from the emission layer EML of the organic layer OL may be one of magenta, cyan, and yellow.

The second electrode CE may be on the organic layer OL. The second electrode CE may reflect light, and may include a material with a lower work function, as compared with the first electrode AE. For example, the second electrode CE may include at least one of Mo, W, Ag, Mg, Al, Pt, Pd, Au, Ni, Nd, Ir, Cr, Li, Ca, and/or an alloy thereof. A partial portion of the light emitted from the organic layer OL may fail to proceed toward the first electrode AE, and may instead proceed toward the second electrode CE. However, the light proceeding toward the second electrode CE may pass through the first electrode AE after being reflected by the second electrode CE. Meanwhile, a conductive layer may be on the second electrode CE to decrease a voltage drop at the second electrode CE.

An encapsulation member 120 may isolate the display element OLED from the outside. The encapsulation member 120 may be a substrate facing the substrate 110. The encapsulation member 120 may include the same material as the base substrate SUB. The encapsulation member 120 may be attached to the substrate 110 by a sealant. The sealant may be in the non-display area NDA.

In addition, a filler is provided in a space between the substrate 110 and the encapsulation layer 120. The filler may prevent or substantially prevent the display element OLED from being damaged by an external impact. With a moisture-absorbing property, the filler may prevent or substantially prevent moisture from permeating into the display element OLED by absorbing the moisture.

The encapsulation member 120 may be an encapsulation layer that includes a plurality of inorganic layers and a plurality of organic layers, and covers the display element OLED. The encapsulation member 120 is disposed on the second electrode CE to prevent or substantially prevent the moisture and oxygen from permeating into the display element OLED. The inorganic layers of the encapsulation member 120 may include at least one of silicon oxide (SiOx), silicon nitride (SiNx), silicon oxynitride (SiON), aluminum oxide (Al2O3), titanium oxide (TiO2), zirconium oxide (ZrOx), and/or tin oxide (ZnO).

Figure 4:
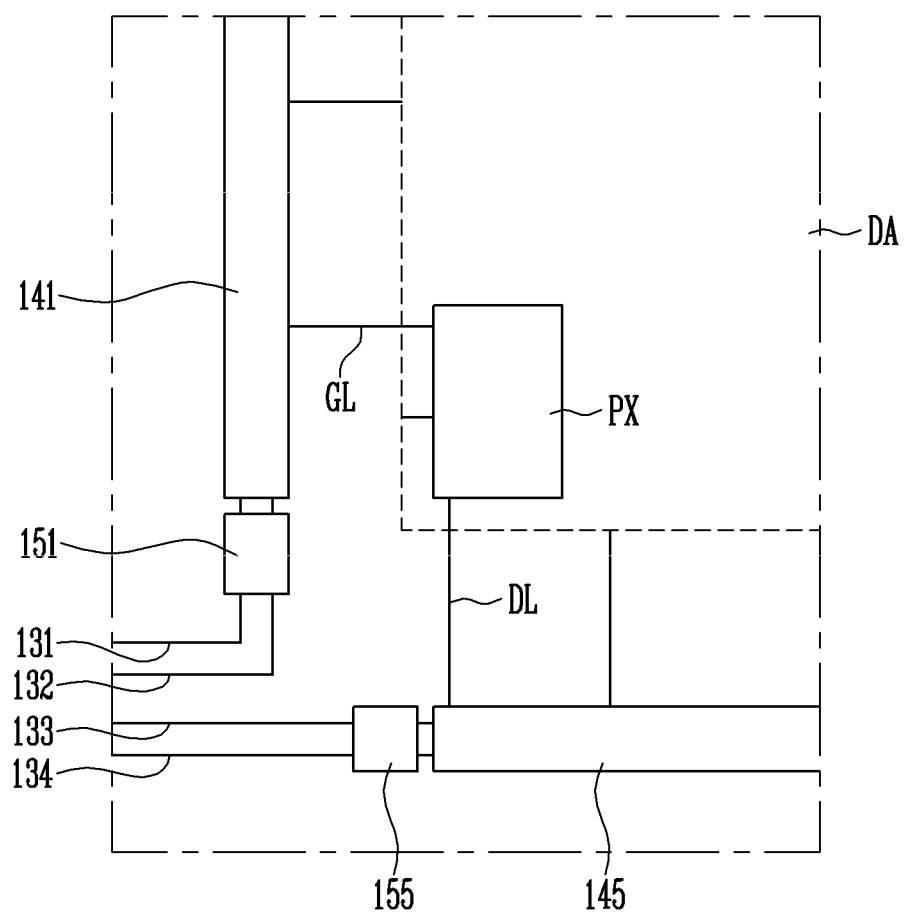
FIG. 4 is a schematic plan view for illustrating a partial portion of the display panel shown in FIG. 1.
Figure 5:
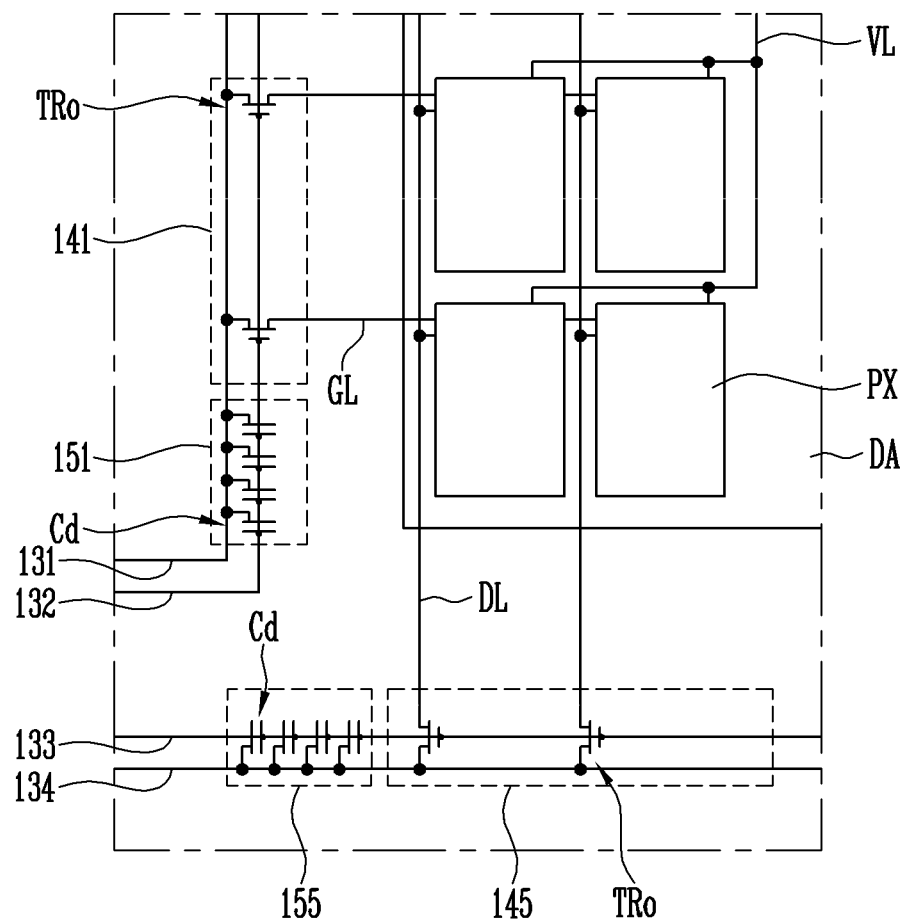
FIG. 5 is a circuit view for illustrating a lighting circuit and a dummy circuit shown in FIG. 4.

FIG. 4 is a schematic plan view for illustrating a partial portion of the display panel shown in FIG. 1, and FIG. 5 is a circuit view for illustrating the lighting circuit and the dummy circuit shown in FIG. 4.

Referring to FIGS. 1 through 5, the display panel 100 may include the display area DA and the non-display area NDA adjacent the display area DA. The display area DA includes the plurality of pixel areas PX in which display elements OLED are respectively disposed. Signal wires 131, 132, 133, and 134, lighting circuits 141 and 145, and dummy circuits 151 and 155 may be located in the non-display area NDA.

The lighting circuits 141 and 145 respectively include a gate lighting circuit 141 having a plurality of lighting thin film transistors TRo connected to the gate lines GL, and a data lighting circuit 145 having a plurality of lighting thin film transistors TRo connected to the data lines DL. Each of the lighting thin film transistors TRo of the gate lighting circuit 141 may be connected to the gate electrode GE of the switching thin film transistor TRs in the pixel area PX, while each of the lighting thin film transistors TRo of the data lighting circuit 145 may be connected to the source electrode SE of the switching thin film transistor TRs in the pixel area PX.

In addition, each of the lighting thin film transistors TRo may include a gate electrode, a source electrode, and a drain electrode. The source and gate electrodes may be connected to the signal wires 131, 132, 133, and 134. Accordingly, the lighting circuits 141 and 145 may turn on the display elements OLED in response to lighting signals supplied through the signal wires 131, 132, 133, and 134.

The signal wires 131, 132, 133, and 134 may be connected to the lighting circuits 141 and 145 and the dummy circuits 151 and 155. In addition, the signal wires 131, 132, 133, and 134 include first signal wires 132 and 133 connected to respective ones of the gate electrodes of the lighting thin film transistors TRo, and second signal wires 131 and 134 connected to respective ones of the source electrodes of the lighting thin film transistors TRo.

The dummy circuits 151 and 155 may be electrically connected to respective ones of the signal wires 131, 132, 133, and 134. The dummy circuits 151 and 155 may first receive external static electricity flowing though the signal wires 131, 132, 133, and 134 before it enters the lighting circuits 141 and 145, thereby preventing or substantially preventing the lighting circuits 141 and 145 from being damaged by the static electricity.

The dummy circuits 151 and 155 may include a plurality of dummy capacitors Cd. Two electrodes of each dummy capacitor Cd may be connected to a respective one of the signal wires 131, 132, 133, and 134.

The dummy capacitors Cd of the dummy circuits 151 and 155 are charged with some of the static electricity coming through the signal wires 131, 132, 133, and 134, thereby preventing or substantially preventing the static electricity from flowing into the lighting circuits 141 and 145. For example, the dummy capacitor Cd that is closest to an inflow path of the static electricity is charged with a partial portion of the static electricity, and the next positioned dummy capacitors Cd are charged with the remaining static electricity. Accordingly, while passing through the lighting circuits 141 and 145, the static electricity is dissipated by the dummy capacitors Cd. That is, the dummy circuits 151 and 155 may prevent or reduce the static electricity from flowing into the lighting circuits 141 and 145.

In addition, even when an entirety of the static electricity is not completely dissipated by the dummy circuits 151 and 155, most of the static electricity may be dissipated by the dummy circuits 151 and 155. Accordingly, even when remaining static electricity flows into the lighting circuits 141 and 145 after passing through the dummy circuits 151 and 155, damage to the lighting circuits 141 and 145 may be prevented.

Figure 6:
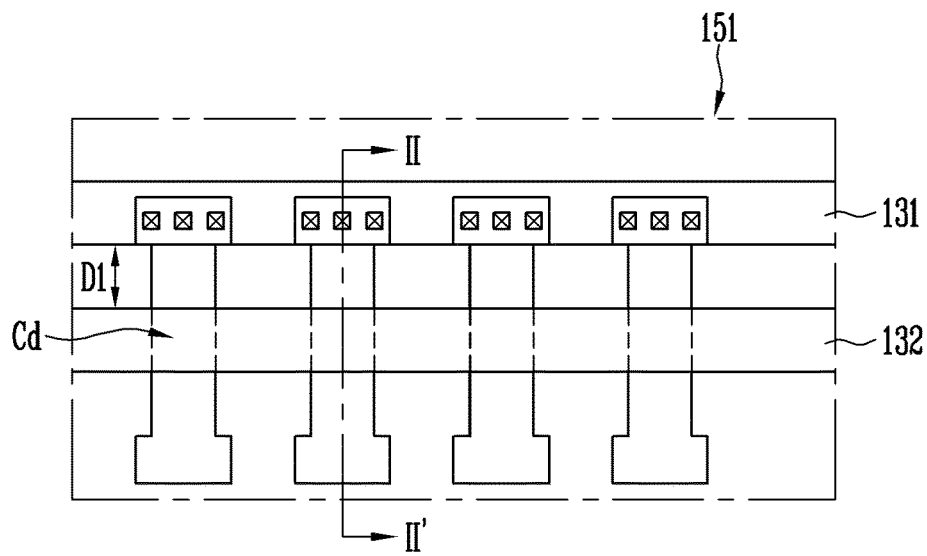
FIG. 6 is a plan view of the dummy circuit shown in FIG. 5.
Figure 7:
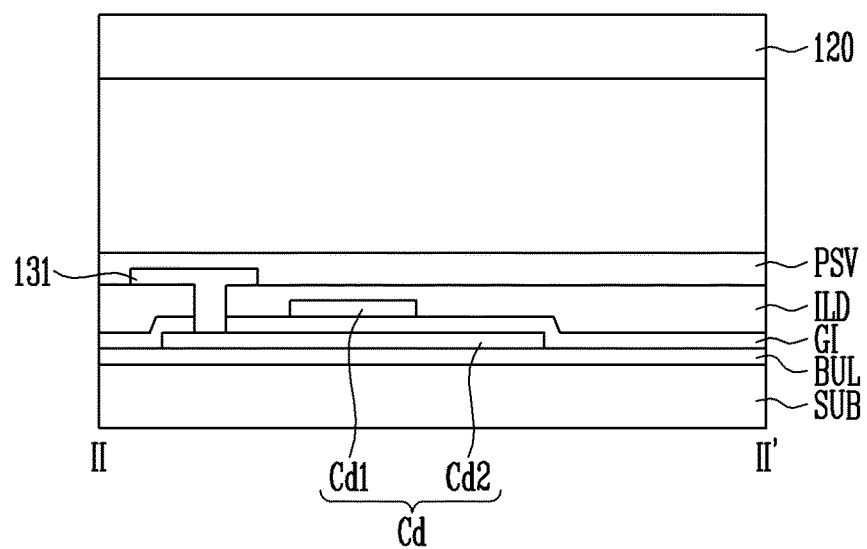
FIG. 7 is a cross-sectional view taken along the line II-II' of FIG. 6.

FIG. 6 is a plan view of the dummy circuit shown in FIG. 5, and FIG. 7 is a cross-sectional view taken along the line II-II' of FIG. 6.

Referring to FIGS. 1 through 7, the dummy circuits 151 and 155 may include a plurality of dummy capacitors Cd electrically connected to respective ones of the signal wires 131, 132, 133, and 134.

Each of the dummy capacitors Cd may include a first dummy capacitor electrode Cd1 and a second dummy capacitor electrode Cd2. The first dummy capacitor electrode Cd1 may be connected to one of the first signal wires 132 and 133. Here, the first dummy capacitor electrode Cd1 and the first signal wires 132 and 133 may be at the same layer as the gate electrodes GE of the switching thin film transistor TRs and of the driving thin film transistor TRd. That is, the first dummy capacitor electrode Cd1 and the first signal wires 132 and 133 may be on the gate insulating layer GI.

The second dummy capacitor electrode Cd2 may be connected to one of the second signal wires 131 and 134 through contact holes. Here, the second signal wires 131 and 134 may be at the same layer as the data line DL. That is, the second signal wires 131 and 134 may be on the interlayer insulating layer ILD.

The second dummy capacitor electrode Cd2 may be at the same layer as the semiconductor layers SA of the switching thin film transistor TRs and of the driving thin film transistor TRd. That is, the second dummy capacitor electrode Cd2 may be under the gate insulating layer GI. In addition, the second dummy capacitor electrode Cd2 may include the same material as the semiconductor layer SA. That is, the second dummy capacitor electrode Cd2 may include at least one of amorphous silicon (a-Si), polycrystalline silicon (p-Si), and a semiconductor oxide. In addition, the second dummy capacitor electrode Cd2 may have conductivity due to doped or injected impurities.

Meanwhile, a distance D1 between the first signal wires 132 and 133 and the second signal wires 131 and 134 may be in a range of about 2 um to about 10 um.

The first signal wires 132 and 133 and the second signal wires 131 and 134 may be insulated from each other by the interlayer insulating layer ILD. In this structure, the interlayer insulating layer ILD may not have sufficient thickness at edge portions of the first signal wires 132 and 133. Accordingly, the edge portions of the first signal wires 132 and 133 may be vulnerable to the static electricity. Particularly, when the distance D1 between the first signal wires 132 and 133 and the second signal wires 131 and 134 are less than about 2 um, short-circuits may occur therebetween. Accordingly, the distance D1 between the first signal wires 132 and 133 and the second signal wires 131 and 134 needs to be about 2 um or more.

In addition, in the case in which the distance D1 between the first signal wires 132 and 133 and the second signal wires 131 and 134 exceeds about 10 um, the non-display area NDA of the display panel 100 may increase.

Another embodiment of the present invention is described below with reference to FIGS. 8 through 12. In FIGS. 8 through 12, the same constituent elements (or components) as the exemplary embodiment shown in FIGS. 1 through 7 are designated by the same reference numerals, and the duplicated description is omitted. In FIGS. 8 through 12, only differences from the foregoing exemplary embodiment will be described to avoid the duplicated description.

Figure 8:
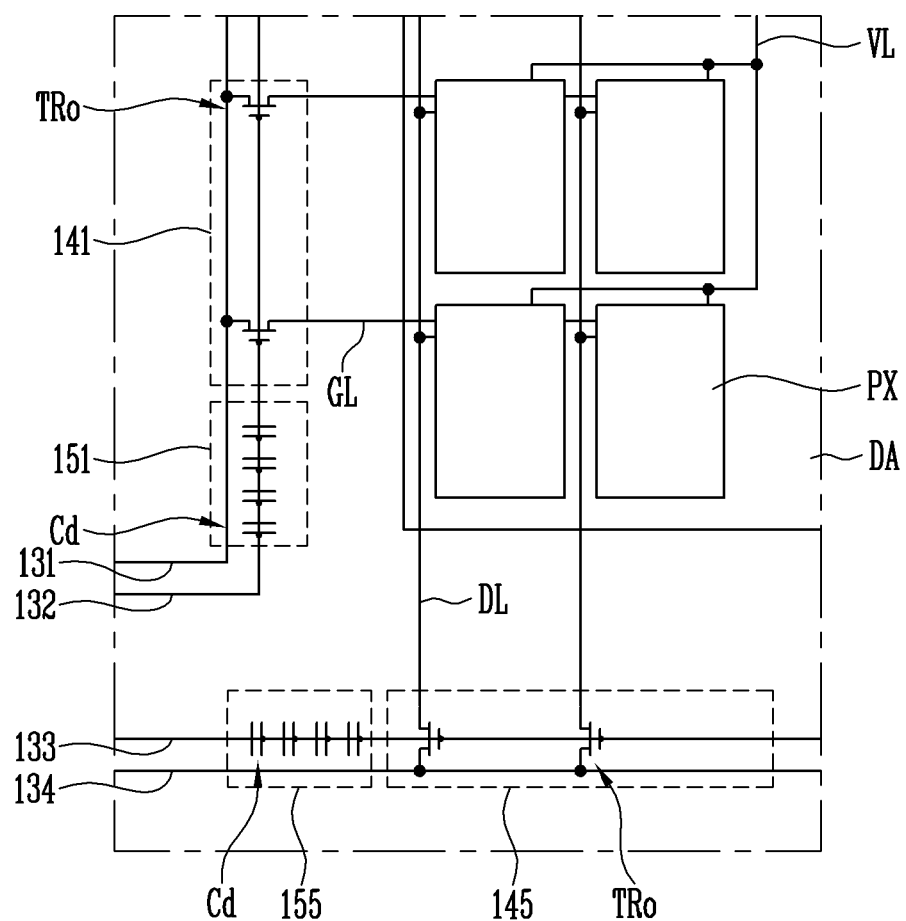
FIG. 8 is a circuit view for illustrating a lighting circuit and a dummy circuit of a display device according to another embodiment of the present invention.
Figure 9:
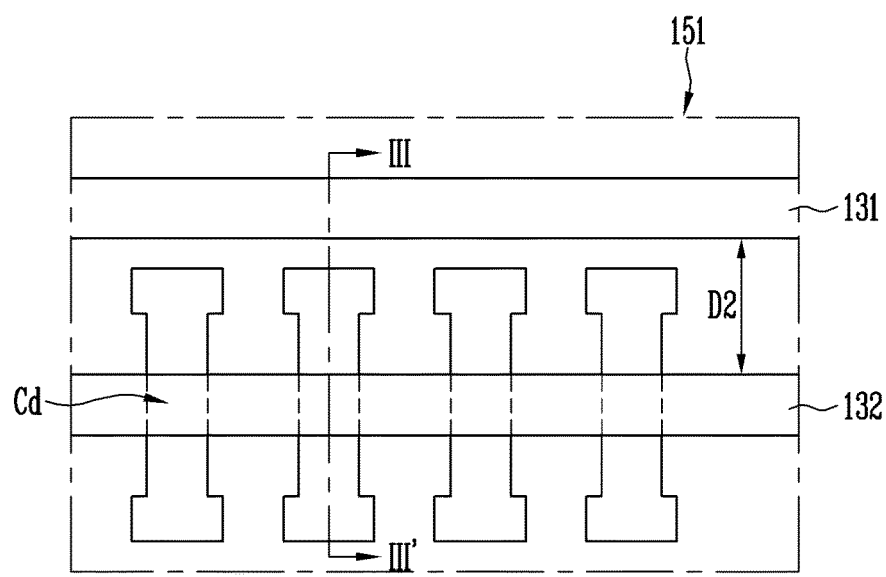
FIG. 9 is a plan view for illustrating the dummy circuit shown in FIG. 8.
Figure 10:
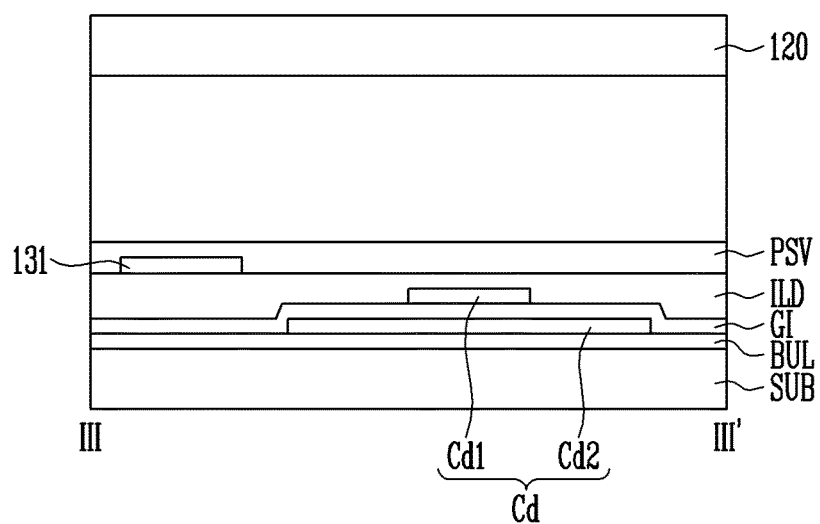
FIG. 10 is a cross-sectional view taken along the line III-III' of FIG. 9.

FIG. 8 is a circuit view for illustrating a lighting circuit and a dummy circuit of a display device according to another embodiment of the present invention, FIG. 9 is a plan view for illustrating the dummy circuit shown in FIG. 8, and FIG. 10 is a cross-sectional view taken along the line III-III' of FIG. 9.

Referring to FIGS. 1 through 4 and FIGS. 8 through 10, the dummy circuits 151 and 155 may include the plurality of dummy capacitors Cd that are electrically connected to respective ones of the signal wires 131, 132, 133, and 134. A distance D2 between the first signal wires 132 and 133 and the second signal wires 131 and 134 may be in a range of about 2 um to about 10 um.

One of first and second electrodes Cd1 and Cd2 of the dummy capacitor Cd may be connected to one of the signal wires 131, 132, 133, and 134. For example, the first dummy capacitor electrode Cd1 of the dummy capacitor Cd may be connected to one of the first signal wires 132 and 133. The first dummy capacitor electrode Cd1 may be at the same layer as the gate electrodes GE of the switching thin film transistor TRs and of the driving thin film transistor TRd of the pixel area PX. In other words, the first dummy capacitor electrode Cd1 may be on the gate insulating layer GI.

The second dummy capacitor electrode Cd2 of the dummy capacitor Cd may be electrically insulated from the signal wires 131, 132, 133, and 134. Particularly, the second dummy capacitor electrode Cd2 may be electrically insulated from the second signal wires 131 and 134. In this case, the second dummy capacitor electrode Cd2 may be at the same layer as the semiconductor layers SA of the switching thin film transistor TRs and of the driving thin film transistor TRd. That is, the second dummy capacitor electrode Cd2 may be under the gate insulating layer GI.

The dummy capacitors Cd are charged with the static electricity coming through respective ones of the signal wires 131, 132, 133, and 134 connected to the first dummy capacitor electrode Cd1, thereby preventing or reducing the likelihood of damage to the lighting circuits 141 and 145 otherwise caused by the static electricity.

In addition, even when a short-circuit occur between the first and second dummy capacitor electrodes Cd1 and Cd2 due to the static electricity, short-circuits between the first and second signal wires 132 and 131, and between the first and second signal wires 134 and 133, do not occur because the second dummy capacitor electrode Cd2 is insulated from the second signal wires 131 and 134.

Figure 11:
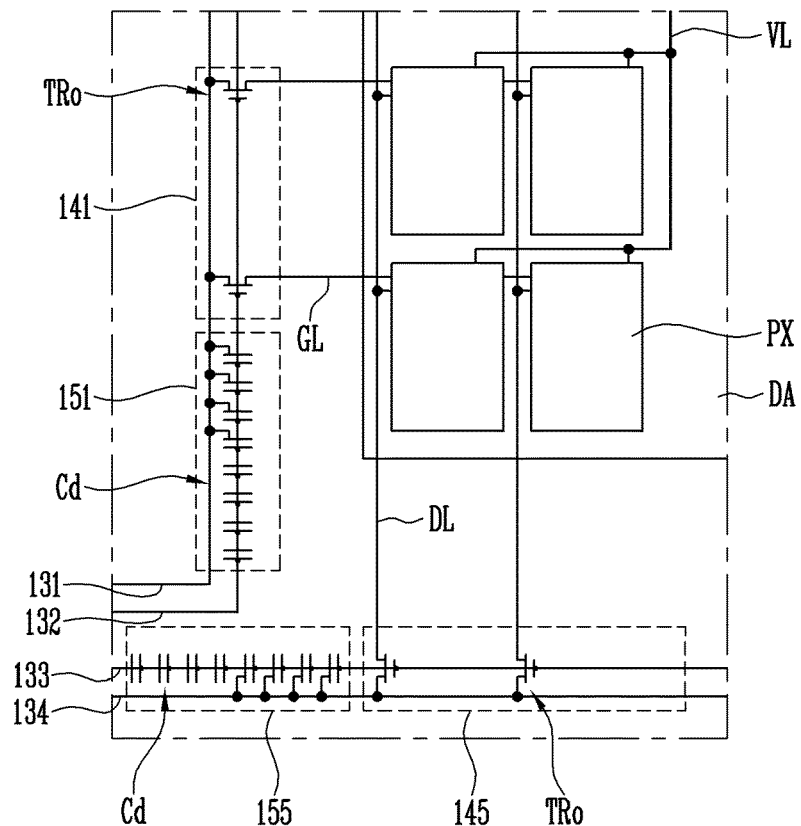
FIG. 11 is a circuit view for illustrating a lighting circuit and a dummy circuit of a display device according to still another embodiment of the present invention.
Figure 12:
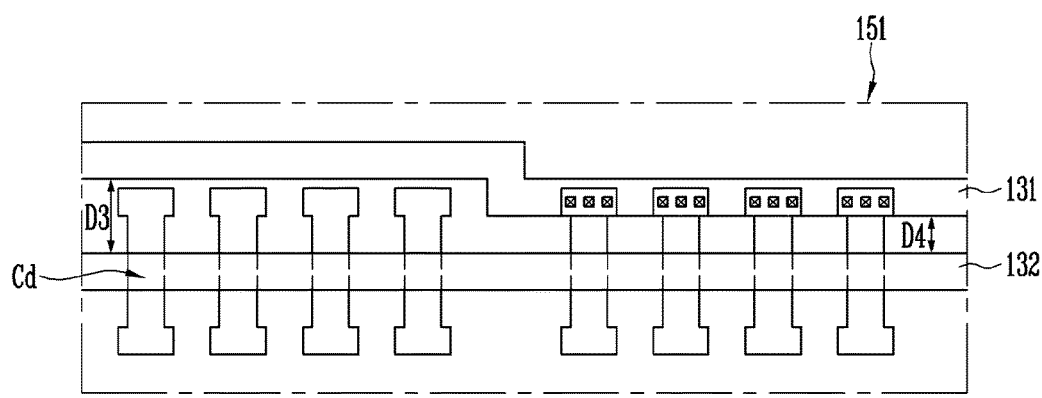
FIG. 12 is a plan view of the dummy circuit shown in FIG. 11.

FIG. 11 is a circuit view for illustrating a lighting circuit and a dummy circuit of a display device according to still another embodiment of the present invention, and FIG. 12 is a plan view of the dummy circuit shown in FIG. 11.

Referring to FIGS. 1 through 4 and FIGS. 11 and 12, the dummy circuits 151 and 155 may include the plurality of dummy capacitors Cd that are electrically connected to the signal wires 131, 132, 133, and 134.

Each of the dummy capacitors Cd may include the first dummy electrode Cd1 and the second dummy electrode Cd2. The first dummy capacitor electrode Cd1 may be connected to the first signal wires 132 and 133. The first dummy capacitor electrode Cd1 may be at the same layer as the gate electrodes GE of the switching thin film transistor TRs and of the driving thin film transistor TRd of the pixel area PX. That is, the first dummy capacitor electrode Cd1 may be on the gate insulating layer GI.

The second dummy capacitor electrodes Cd2 of some of the dummy capacitors Cd may be insulated from the second signal wires 131 and 134, the remaining second dummy electrodes Cd2 may be connected to the second signal wires 131 and 134. Regions in which the second dummy capacitor electrodes Cd2 and the second signal wires 131 and 134 contact each other may be between regions in which the second dummy capacitor electrodes Cd2 and the second signal wires 131 and 134 are insulated and between the lighting circuits 141 and 145.

In addition, the second dummy capacitor electrodes Cd2 may be at the same layer as the semiconductor layers SA of the switching thin film transistor TRs and of the driving thin film transistor TRd. In other words, the second dummy capacitor electrode Cd2 may be under the gate insulating layer GI.

A distance D3 and D4 between the first signal wires 132 and 133 and the second signal wires 131 and 134 may be in a range of about 2 um to about 10 um.

In addition, the distance D3 between the first signal wires 132 and 133 and the second signal wires 131 and 134 in a region (e.g., a second region) in which the second dummy capacitor electrode Cd2 is insulated from the second signal wires 131 and 134 may be larger than the distance D4 between the first signal wires 132 and 133 and the second signal wires 131 and 134 in a region (e.g., a first region) in which the second dummy capacitor electrode Cd2 is connected to the second signal wires 131 or 134.

Example embodiments have been disclosed herein and although specific terms are employed, they are used and are to be interpreted in a generic and descriptive sense only and not for purpose of limitation. In some instances, as would be apparent to one of ordinary skill in the art, features, characteristics, components, and/or elements described in connection with a particular embodiment may be used singly or in combination with features, characteristics, components, and/or elements described in connection with other embodiments unless otherwise specifically indicated. Accordingly, it will be understood by those of skill in the art that various changes in form and details may be made without departing from the spirit and scope of the embodiments of the present invention as set forth in the following claims and their equivalents.

What is claimed is:

1. A display device comprising:
a display panel having a display area with a plurality of pixel areas, and a non-display area adjacent the display area, the display panel comprising a substrate comprising:
   at least one thin film transistor in each of the pixel areas; and
   a display element connected to the thin film transistor;
lighting circuits in the non-display area on the substrate that are configured to check lighting states of the display element;
signal wires in the non-display area on the substrate that are configured to supply a signal to the lighting circuits; and
dummy circuits comprising a plurality of dummy capacitors, each dummy capacitor comprising:
   a first dummy capacitor electrode; and
   a second dummy capacitor electrode,
wherein the dummy circuits are configured to collect external static electricity from the signal wires before the external static electricity flows into the lighting circuits,
wherein the lighting circuits comprise a lighting thin film transistor comprising:
   a gate electrode;
   a source electrode; and
   a drain electrode,
wherein the signal wires comprise:
   a first signal wire connected to the gate electrode of the lighting thin film transistor; and
   a second signal wire connected to the source electrode of the lighting thin film transistor,
wherein the first dummy capacitor electrode is connected to the first signal wire, and
wherein the second dummy capacitor electrode is insulated from the first and second signal wires.

2. The display device of claim 1, wherein a distance between the first signal wire and the second signal wire is in a range of about 2 um to about 10 um.

3. The display device of claim 2, wherein the thin film transistor in the pixel area comprises:
   a semiconductor layer;
   a gate electrode;
   a gate insulating layer for insulating the semiconductor layer from the gate electrode;
   a source electrode; and
   a drain electrode,
   wherein the first dummy capacitor electrode is at the same layer as the gate electrode of the thin film transistor in the pixel area, and
   wherein the second dummy capacitor electrode is at the same layer as the semiconductor layer.

4. The display device of claim 3, further comprising an interlayer insulating layer covering the gate electrode,
   wherein the first signal wire is at the same layer as the first dummy capacitor electrode, and
   wherein the second signal wire is on the interlayer insulating layer.

5. A display device comprising:
a display panel having a display area with a plurality of pixel areas, and a non-display area adjacent the display area, the display panel comprising a substrate comprising:
   at least one thin film transistor in each of the pixel areas; and
   a display element connected to the thin film transistor;
lighting circuits in the non-display area on the substrate that are configured to check lighting states of the display element;
signal wires in the non-display area on the substrate that are configured to supply a signal to the lighting circuits; and
dummy circuits comprising a plurality of dummy capacitors, each dummy capacitor comprising:
   a first dummy capacitor electrode; and
   a second dummy capacitor electrode,
wherein the dummy circuits are configured to collect external static electricity from the signal wires before the external static electricity flows into the lighting circuits,
wherein the lighting circuits comprise a lighting thin film transistor comprising:
   a gate electrode;
   a source electrode; and
   a drain electrode, and
wherein the signal wires comprise:
   a first signal wire connected to the gate electrode of the lighting thin film transistor; and
   a second signal wire connected to the source electrode of the lighting thin film transistor,
wherein the first dummy capacitor electrode is connected to the first signal wire,
wherein the second dummy capacitor electrode of some of the plurality of the dummy capacitors are insulated from the first and second signal wires, and
wherein the second dummy capacitor electrode of others of the plurality of the dummy capacitors are connected to the second signal wire.

6. The display device of claim 5, wherein the second dummy capacitor electrode of one of the plurality of the dummy capacitors is connected to the second signal wire at a first region between the lighting circuit and a second region at which the second dummy capacitor electrode of another one of the plurality of the dummy capacitors is insulated from the second signal wire.

7. The display device of claim 6, wherein a distance between the first signal wire and the second signal wire is in a range of about 2 um to about 10 um.

8. The display device of claim 7, wherein a distance between the first signal wire and the second signal wire in the second region is larger than a distance between the first signal wire and the second signal wire in the first region.

9. The display device of claim 8, wherein the thin film transistor in the pixel area comprises:
   a semiconductor layer;
   a gate electrode;
   a gate insulating layer for insulating the semiconductor layer from the gate electrode;
   a source electrode; and
   a drain electrode,
   wherein the first dummy capacitor electrode is at the same layer as the gate electrode of the thin film transistor in the pixel area, and
   wherein the second dummy capacitor electrode is at the same layer as the semiconductor layer.

10. The display device of claim 9, further comprising an interlayer insulating layer covering the gate electrode,
   wherein the first signal wire is at the same layer as the first dummy capacitor electrode, and
   wherein the second signal wire is on the interlayer insulating layer.

* * * * *